United States Patent
Yamazaki

[19]

[11] Patent Number: 5,877,083
[45] Date of Patent: Mar. 2, 1999

[54] METHOD OF MANUFACTURING A SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 550,232

[22] Filed: Oct. 30, 1995

[30] Foreign Application Priority Data

Nov. 1, 1994 [JP] Japan .................................. 6-292260

[51] Int. Cl.$^6$ ............................................. H01L 21/4763
[52] U.S. Cl. .......................... 438/635; 438/155; 438/165; 438/635
[58] Field of Search ............................. 438/30, 155, 163, 438/165, 635, 624, 768

[56] References Cited

U.S. PATENT DOCUMENTS

| | | | |
|---|---|---|---|
| 5,236,573 | 8/1993 | Shannon | 205/122 |
| 5,264,728 | 11/1993 | Ikeda et al. | 257/761 |
| 5,508,216 | 4/1996 | Inoue | 438/166 |
| 5,585,290 | 12/1996 | Yamamoto | 438/155 |

FOREIGN PATENT DOCUMENTS

| | | |
|---|---|---|
| 55-67151 | 5/1980 | Japan . |
| 57-2530 | 1/1982 | Japan . |
| 59-108359 | 6/1984 | Japan . |
| 60-54478 | 3/1985 | Japan . |
| 63-124469 | 5/1988 | Japan . |
| 1-110749 | 4/1989 | Japan . |
| 1-91436 | 4/1989 | Japan . |
| 1-185522 | 7/1989 | Japan . |
| 2-1134 | 1/1990 | Japan . |
| 2-163981 | 6/1990 | Japan . |
| 4-302439 | 10/1992 | Japan . |

OTHER PUBLICATIONS

Translation of JP 1–185522, Jun. 1989.

*Primary Examiner*—Charles Bowers
*Assistant Examiner*—Scott J. Hawranek
*Attorney, Agent, or Firm*—Sixbey, Friedman, Leedom & Ferguson, PC; Gerald J. Ferguson, Jr.; Eric J. Robinson

[57] ABSTRACT

It is intended to reduce occurrences of interlayer short-circuiting due to pinholes existing in an interlayer insulating film particularly in a circuit formed on an insulating substrate. A wiring line mainly made of an anodizable metal such as aluminum, tantalum, titanium, or the like is formed on an insulating surface, and an interlayer insulating film is so formed as to cover the metal wiring line. The substrate is then immersed in an electrolyte of, for instance, ammonium tartrate. Portions of the metal wiring line which are exposed by the pinholes of the interlayer insulating film are selectively anodized by allowing a current to flow through the wiring line by using it as one of the electrodes and gradually increasing a voltage difference between the wiring line and the opposed electrode. Thus, insulation performance of the interlayer insulating film is improved.

12 Claims, 5 Drawing Sheets

METHOD OF MANUFACTURING A SEMICONDUCTOR DEVICE

BACKGROUND OF THE INVENTION

1. Field of the Invention

The present invention relates to a manufacturing method of a semiconductor circuit or device having thin-film transistors (generally called TFTs) which circuit or device is used in an active matrix liquid crystal display and an image sensor.

2. Description of the Prior Art

In recent years, the technology of forming TFTs on an insulating substrate has been developed and is applied to manufacture of liquid crystal displays, image sensors, etc. Interlayer short-circuiting was a problem to be solved in developing such a technology. The technology of forming TFTs on an insulating substrate is similar to that of forming a semiconductor integrated circuit. However, these two technologies are different from each other in the following points, which are presumed to be causes of the interlayer short-circuiting problem.

First, because of the use of an insulating substrate, it is difficult to remove static electricity and, therefore, dust such as film forming dust likely attaches to a substrate. If an interlayer insulating film is formed without removing a dust piece attached to a substrate, the dust piece causes a pinhole when later peel off, reducing the interlayer insulation.

Second, because of the heat resistance of a substrate, the reflow technique for a phospho-silicate glass (PSG) cannot be used, which is commonly used in manufacture of semiconductor integrated circuits. Further, the methods of forming an interlayer insulating film are limited to plasma CVD and the like. Therefore, the step-coating performance is insufficient, and dust etc. likely occur during film formation. Insufficient step-coating performance likely causes cracks etc. in an interlayer insulating film, possibly resulting in interlayer short-circuiting.

SUMMARY OF THE INVENTION

The present invention has been made in view of the above problems in the art, and has an object of improving insulation between wiring layers.

The present invention attains the above object by improving the insulation by filling up a pinhole, a crack, or the like that may occur in an interlayer insulating film between a lower metal wiring line and an upper layer such as another metal wiring line, a semiconductor coating, or some other conductive coating.

The present invention employs, for a lower metal wiring line to be formed on an insulating substrate, a material that can be anodized. After an interlayer insulating film is formed on the lower metal wiring line, the resulting structure and a negative electrode is immersed in a proper electrolyte, and the same process (hereinafter referred to as "anodic oxidation process") as what is called a barrier type anodic oxidation is performed by applying a positive voltage to the metal wiring line and a negative voltage to the negative electrode. Then, another metal wiring line, a semiconductor coating, or some other conductive coating is formed. According to this process, even if the lower metal wiring line is exposed by a pinhole, a crack, or the like occurring in the interlayer insulating film, the exposed portion of the metal wiring line is given an insulating coating by oxidation.

For the above purpose, it is desired that the lower metal wiring line be mainly made of aluminum, tantalum or titanium. In particular, where aluminum is used as the wiring line material, inclusion of a proper amount of scandium (Sc), zirconium (Zr), or the like is effective in suppressing hillocks (protrusions formed on the top or side surface of a film due to abnormal growth of an aluminum crystal). On the other hand, addition of silicon as usually done to suppress hillocks is not preferable because silicon-added aluminum cannot provide a good anodic oxide film.

The present invention does not require that the entire lower metal wiring line be covered with the interlayer insulating film. Since the invention is intended to prevent short-circuiting between wiring lines, it suffices that the interlayer insulating film be formed only at portions where short-circuiting between wiring lines is likely to occur, i.e., at the intersecting portions of the upper and lower wiring lines.

For example, in a top-gate TFT, there occurs no problem even if no interlayer insulating film is formed on the active layer, because on the active layer, the gate electrode/wiring line does not cross the upper wiring line. In such a case, the lower metal wiring line (in this case, the gate electrode/wiring line) is immersed in the electrolyte with its surface exposed, ordinary anodic oxidation occurs to form anodic oxide films on the side and top faces of the gate electrode. In particular, the side anodic oxide films are effective in forming a structure having offset regions as disclosed in Japanese Unexamined Patent Publication No. 5-67667.

In the present invention, it is preferred that the lower metal wiring line be electrically insulated from any wiring lines or conductive materials located below the lower metal wiring line, as in the case of a gate wiring line. This is so because if the lower metal wiring line is not insulated, a current leaks through an unintended path in the anodic oxidation step to prevent anodic oxidation of the lower metal wiring line.

For example, assume that an interlayer insulating film is formed in a state that a metal wiring line is connected to an N-type silicon film. If a pinhole exists in both of the N-type silicon film and the interlayer insulating film that covers the metal wiring line, a large part of the current flows through the N-type silicon film even if it is intended to anodize the metal wiring line. However, since the N-type silicon film is not anodized, more correctly, a highly insulating coating cannot be obtained, a current flows through the pinhole of the N-type silicon film and, therefore, the pinhole of the interlayer insulating film above the metal wiring line is not filled up. Therefore, it is preferred that the metal wiring line be electrically insulated from any wiring lines or conductive materials located below the metal wiring line, to prevent leakage of a current through an unintended path in an anodic oxidation step.

The present invention can be practiced in the same manner in either the top-gate TFT or the bottom-gate TFT. Particularly in the bottom-gate TFT, if the gate electrode/wiring line is made by the lower wiring line, the inter layer insulating film also serves as the gate insulating film.

The function of the invention will be described with reference to FIGS. 5A to 5C. When an interlayer insulating film 502 is formed so as to cover a lower metal wiring line 501, a number of pinholes/cracks 503 are formed due to dust and insufficient step-coating performance. If an upper wiring line is formed in this state, it will be short-circuited with the bottom wiring line 501 through the pinholes/cracks 503. (FIG. 5A) In contrast, if the anodic oxidation step of the invention is performed, the portions of the metal wiring line 501 corresponding to the pinholes/cracks 503 are anodized to form highly insulating oxide portions 504. Although the pinholes 503 that are not in contact with the metal wiring line 501 are left as they are, this causes no problem because those pinholes 503 do not contribute to the short-circuiting between the upper and lower wiring lines. (FIG. 5B)

When an upper layer metal wiring line 505 is formed in this state, it does not contact with the lower metal wiring line 501 because the anodic oxide portions 504 exist in the pinholes 503. Thus, no interlayer short-circuiting occurs. (FIG. 5C)

The insulation performance of the anodic oxide portion 504 formed in the pinhole 503 depends on its thickness, which depends on the maximum voltage of the anodic oxidation. That is, better insulation performance is obtained with a higher maximum voltage. However, the application voltage should be determined in accordance with the device structure, because an excessively high voltage may cause dielectric breakdown in the device. Although sufficient insulation performance is generally obtained with a maximum voltage of 100 V or higher, the maximum voltage may be set lower than 100 V.

For the same purpose, it has conventionally been proposed to perform similar anodic oxidation in the bottom-gate TFT, as shown in FIGS. 6A to 6C. Usually, lower metal wiring lines 602 and 603 are formed on an insulating surface 601. The metal wiring line 602 also serves as a gate electrode. Anodic oxide coatings 604 and 605 having a proper thickness are then formed on the surfaces of the metal wiring lines 602 and 603 by anodizing those. (FIG. 6A)

An interlayer insulating film 606 is then formed. (FIG. 6B)

Subsequently, an active layer 607, an etching stopper 608, a source and a drain 609, and upper wiring lines 610 and 611 made of a transparent conductive material or the like are sequentially formed. This structure can improve insulation performance of a portion 612 where the lower metal wiring line 603 and the upper wiring line 611 intersect each other, because there exist, between the wiring lines 603 and 611, the highly insulating anodic oxide film 605 in addition to the interlayer insulating film 606.

However, this manufacturing method has the following problems.

First, since the gate insulating film includes the metal oxide (anodic oxide) film, in general the TFT characteristics are not good. Although this is not a serious problem in an amorphous silicon TFT having a low electric field mobility, it is very disadvantageous in a crystalline silicon TFT having a high electric field mobility.

Second, if the anodic oxide film 605 exists at a position where a contact hole is to be formed in the interlayer insulating film 606, it is very difficult to etch the anodic oxide film 605. Since it is almost impossible to etch the anodic oxide film 605 by dry etching, wet etching is usually employed. However, the use of wet etching causes problems that the etching rate of the anodic oxide film 605 is slower than those of silicon oxide and silicon nitride that are usually used as materials for a gate insulating film, and that a different etchant is needed. Therefore, in a step of forming a contact hole, extra steps and processing devices are needed to eliminate the anodic oxide film 605.

For example, where aluminum is used for the lower wiring line, the anodic oxide film 605 is aluminum oxide. Although chromic acid is available as an etchant for aluminum oxide, it is now desired not to use chromic acid because it produces harmful hexavalent chromium when flowing out as a waste liquid. This problem is not limited to the bottom-gate TFT, but common to all the cases where the surface of the lower wiring line is anodized to improve the interlayer insulation performance.

The present invention is effective in solving both of the first and second problems mentioned above. As for the first problem, according to the present invention, since not the entire surface of the gate electrode is anodized, the influences of the anodic oxide film on the TFT characteristics are very small. As for the second problem, since not the entire surface of the lower wiring line is covered with the anodic oxide film, dry etching can also be used to form a contact hole. Even in the case of using wet etching, it is virtually sufficient to etch only the interlayer insulating film. Therefore, the process is simplified and it is not necessary to use harmful chemicals.

DETAILED DESCRIPTION OF THE PREFERRED EMBODIMENTS

Embodiment 1

Figure 1A:
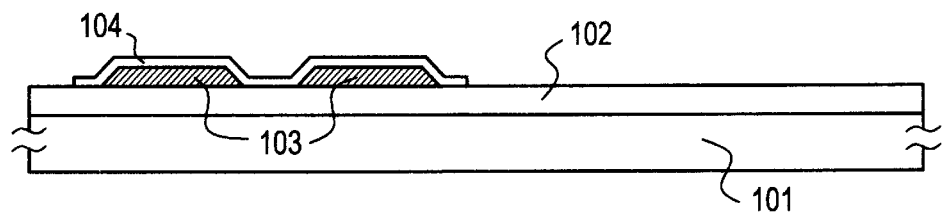
FIGS. 1A to 1E show a manufacturing process according to a first embodiment of the present invention.

FIGS. 1A to 1E show a manufacturing process according to this embodiment. First, as shown in FIG. 1A, a 3,000 Å thick silicon oxide film 102 as a buffer film is formed on a glass substrate 101 (barium borosilicate glass; in this embodiment, Corning 7059) by sputtering or plasma CVD. Then, a 3,000 Å thick polycrystalline or microcrystalline silicon film that is given N-type conductivity by phosphorus doping is formed by plasma CVD or low-pressure thermal CVD, and etched into island-like regions 103, which will become a source and a drain of a TFT. Further, a 300 Å thick amorphous silicon film is formed by plasma CVD or low-pressure thermal CVD, and etched into an island-like region 104. In this embodiment, the island-like region 104 is so formed as to cover the island-like regions 103. The island-like region 104 will become an active layer of the TFT. (FIG. 1A)

Figure 1B:
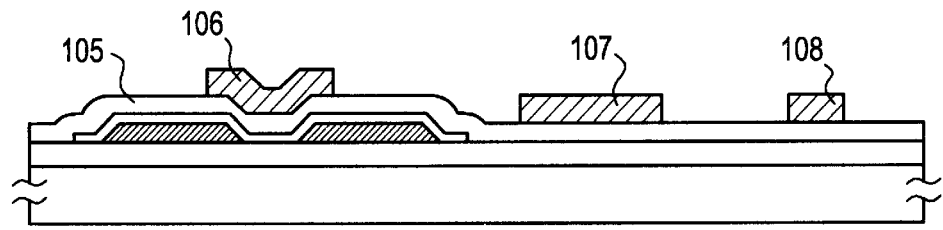

Subsequently, a 3,000 Å thick silicon nitride film 105 as a gate insulating film is formed by plasma CVD. A 5,000 Å thick aluminum film is formed by sputtering. If scandium (Sc) of 0.1 to 0.5 wt % or zirconium (Zr) of 0.2 to 4 wt % is added to the aluminum film, hillocks can be suppressed and pinholes can be filled up effectively. The aluminum film is then etched to form a gate electrode 106 and gate wiring lines 107 and 108. (FIG. 1B)

Figure 1C:
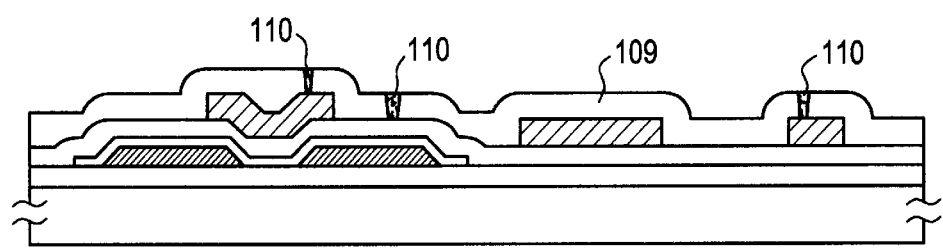

Thereafter, a 4,000 Å thick silicon oxide film 109 as an interlayer insulating film is formed by plasma CVD. For various reasons, pinholes/cracks 110 occur in the silicon oxide film 109. (FIG. 1C)

Figure 1D:
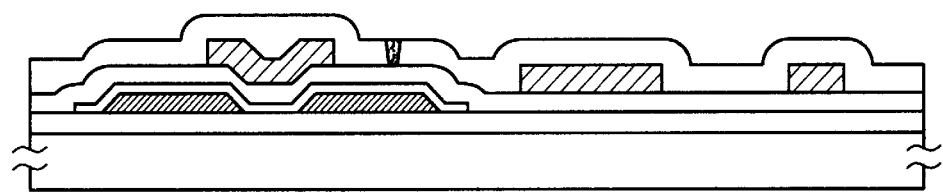

The pinholes/cracks 110 are filled up by anodic oxidation in the following manner. First, the glass substrate 101 and a platinum electrode (negative electrode) are immersed in an ethylene glycol solution containing 5%-tartaric acid which solution is adjusted by means of ammonia so as to have a pH value of 6.9 to 7.1. A positive voltage is applied to the gate electrode 106 and the gate wiring lines 107 and 108 on the glass substrate 101, whereas a negative voltage is applied to the platinum electrode. The voltage difference is increased to a maximum of 120 V at a rate of 1 to 10 V/min. As a result, the surfaces of the portions of the gate electrode 106 and gate wiring lines 107 and 108 which portions are exposed by the pinholes/cracks 110 are anodized to fill up the pinholes/cracks 110. Although the pinholes that are not in contact with the gate electrode 106 nor the gate wiring lines 107 and 108 are left as they are, this causes no problem because those pinholes do not contribute to interlayer short-circuiting. (FIG. 1D)

Figure 1E:
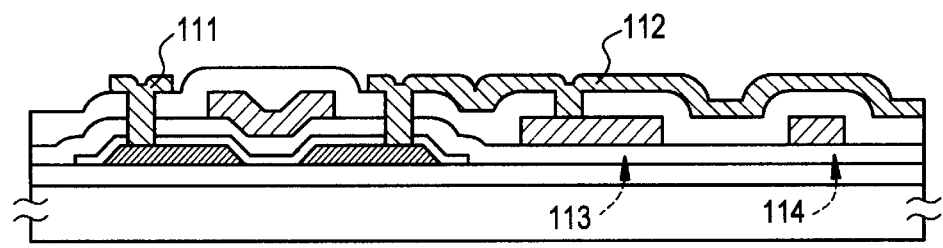

Subsequently, contact holes are formed through the interlayer insulating film 109 and the gate insulating film 105, and aluminum wiring lines 111 and 112 are formed by an ordinary wiring line forming technique. Aluminum may be mixed with silicon or tungsten by 1 to 5 atomic %. In particular, the contact hole 113 for the gate wiring line 107 can easily be formed by etching substantially only the interlayer insulating film 109. By virtue of filling up the pinholes/cracks 110, interlayer short-circuiting at an intersection 114 of the gate wiring line 108 and the metal wiring line 112 can be prevented. (FIG. 1E)

The basic circuitry is formed by the above process. Further, wiring lines, an interlayer insulating film, a transparent conductive coating, etc. may be formed above the structure described above.

Embodiment 2

Figure 2A:
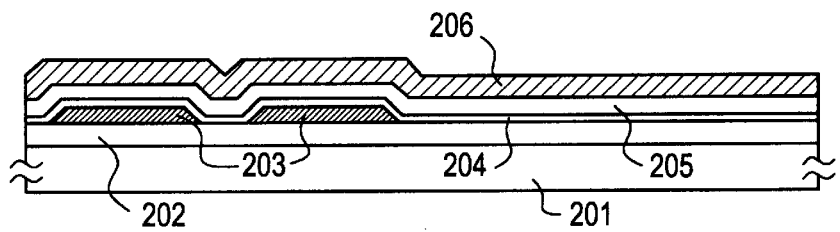
FIGS. 2A to 2E show a manufacturing process according to a second embodiment of the invention.

FIGS. 2A to 2E show a manufacturing process of this embodiment. As shown in FIG. 2A, first, a 2,000 Å thick silicon oxide film 202 as a buffer film is formed on a glass substrate 201 (alumina silicate glass; in this embodiment, Corning 1737) by sputtering or plasma CVD. Then, a 3,000 Å thick amorphous silicon film that is given N-type conductivity by phosphorus doping is formed by plasma CVD or low-pressure thermal CVD, and etched into island-like regions 203, which will become a source and a drain of a TFT.

Further, a 500 Å thick amorphous silicon film is formed by plasma CVD or low-pressure thermal CVD, and crystallized by thermal annealing at 500° to 650° C. into crystalline silicon film 204. For example, the thermal annealing is performed at 550° C. for four hours. As for the thermal annealing, as disclosed in Japanese Unexamined Patent Publication No. 6-244104, the crystallization of the amorphous silicon film can be performed at a lower temperature in a shorter period by preliminarily adding, to the amorphous silicon film, a very small amount of a metal element such as nickel, cobalt, palladium, iron, platinum, or the like.

Subsequently, a 3,000 Å thick silicon nitride film 205 as a gate insulating film is formed by plasma CVD. A 5,000 Å thick aluminum film 206 is formed by sputtering. If scandium (Sc) of 0.1 to 0.5 wt % or zirconium (Zr) of 0.2 to 4 wt % is added to the aluminum film 206, hillocks can be prevented. (FIG. 2A)

A gate electrode 209, gate wiring lines 210 and 211, a gate insulating film 208, and an active layer 207 are formed by etching the aluminum film 206, silicon oxide film 205 and crystalline silicon film 204. Although the TFT of this embodiment is of a normally staggered type as in the case of the first embodiment, this embodiment can reduce the number of steps because the gate electrode 209, gate wiring lines 210 and 211, gate insulating film 208 and active layer 207 can be formed simultaneously by a single etching step.

Figure 2B:
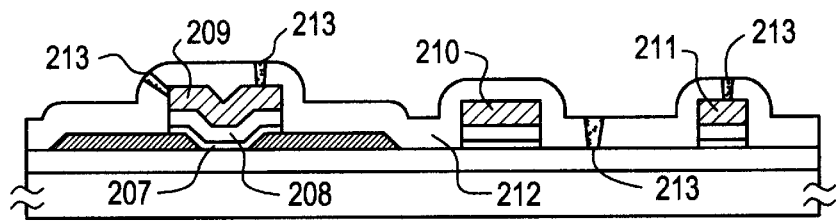

Thereafter, a 3,000 Å thick silicon oxide film 212 as an interlayer insulating film is formed by plasma CVD. For various reasons, pinholes/cracks 213 occur in the silicon oxide film 212. In particular, in this embodiment, the cracks 213 are remarkable in the side faces of the gate electrode 209 because of low step-coating performance there, which results from the facts that the silicon oxide film 212 is thinner than the counterpart in the first embodiment and that the gate electrode 209 below the silicon oxide film 212 causes steps higher than the counterparts in the first embodiment by the height of the gate insulating film 208. (FIG. 2B)

Figure 2C:
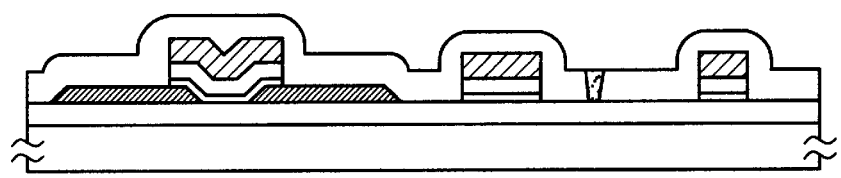

Therefore, to fill up the pinholes/cracks 213, anodic oxidation similar to that in the first embodiment is performed. First, the glass substrate 201 and a platinum electrode (negative electrode) are immersed in an ethylene glycol solution containing 5%-tartaric acid which solution is adjusted by means of ammonia so as to have a pH value of 6.9 to 7.1. A positive voltage is applied to the gate electrode 209 and the gate wiring lines 210 and 211 on the glass substrate 201, whereas a negative voltage is applied to the platinum electrode. The voltage difference is increased to a maximum of 150 V at a rate of 1 to 10 V/min. As a result, the surfaces of the portions of the gate electrode 209 and gate wiring lines 210 and 211 which portions are exposed by the pinholes/cracks 213 are anodized to fill up the pinholes/cracks 213. Although the pinholes 213 that are not in contact with the gate electrode 209 nor the gate wiring lines 210 and 211 are left as they are, they do not contribute to interlayer short-circuiting. (FIG. 2C)

Figure 2D:
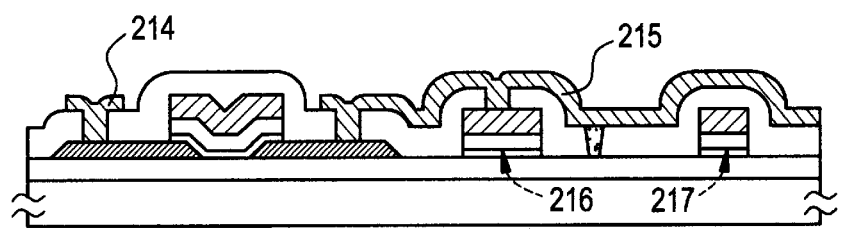

Subsequently, contact holes are formed through the silicon oxide film 212, and aluminum wiring lines 214 and 215 are formed by an ordinary wiring line forming technique. It is preferred that aluminum be mixed with silicon or tungsten by 1 to 5 atomic %. The contact hole 216 for the gate wiring line 210 can easily be formed by etching substantially only the silicon oxide film 212. By virtue of filling up the pinholes/cracks 213, there occur no interlayer short-circuiting at an intersection 217 of the gate wiring line 211 and the metal wiring line 215. (FIG. 2D)

Figure 2E:
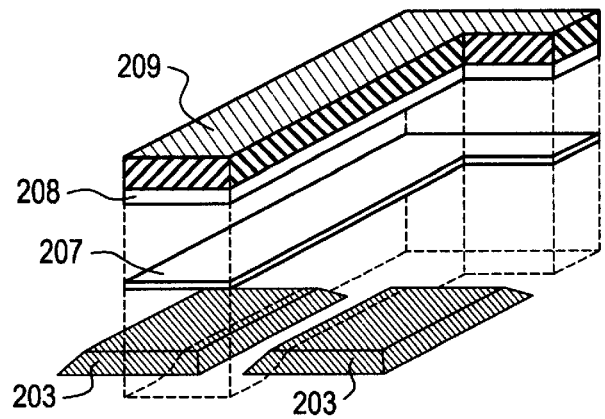

The basic circuitry is formed by the above process. The reversely staggered TFT of this embodiment has a structure that is different from the ordinary one. FIG. 2E shows its layered structure. Further, wiring lines, an interlayer insulating film, a transparent conductive coating, etc. may be formed above the structure described above.

Embodiment 3

Figure 3A:
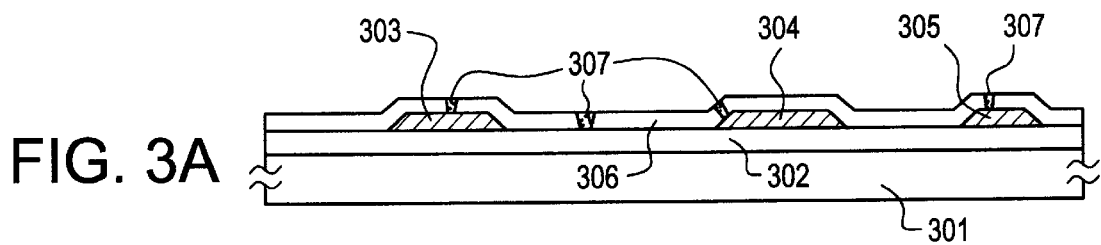
FIGS. 3A to 3E show a manufacturing process according to a third embodiment of the invention.

FIGS. 3A to 3E show a manufacturing process according to this embodiment. First, as shown in FIG. 3A, a 3,000 Å thick silicon oxide film 302 as a buffer film is formed on a glass substrate 301 (barium borosilicate glass; in this embodiment, Corning 7059) by sputtering or plasma CVD. Then, a 3,000 Å thick tantalum film is deposited by sputtering, and etched to form a gate electrode 303 of a TFT and gate wiring lines 304 and 305.

Subsequently, a 3,000 Å thick silicon nitride film 306 as a gate insulating film is deposited by plasma CVD. At this stage, a number of pinholes/cracks 307 exist in the silicon nitride film 306. (FIG. 3A)

Figure 3B:
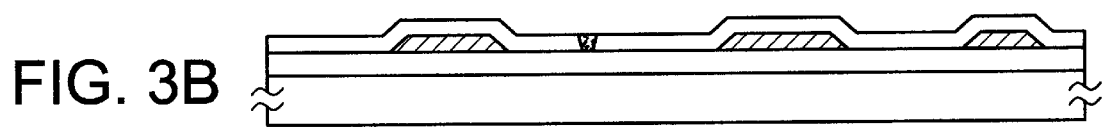

The pinholes/cracks 307 are filled up by anodic oxidation in the following manner. First, the substrate 301 and a platinum electrode (negative electrode) are immersed in an ethylene glycol solution containing 5%-ammonium tartrate (pH=6.9 to 7.1). A positive voltage is applied to the gate electrode 303 and the gate wiring lines 304 and 305 on the substrate 301, whereas a negative voltage is applied to the platinum electrode. The voltage difference is increased to a maximum of 60 V at a rate of 1 to 10 V/min. As a result, the surfaces of the portions of the gate electrode 303 and gate wiring lines 304 and 305 which portions are exposed by the pinholes/cracks 307 are anodized to fill up the pinholes/cracks 307. (FIG. 3B)

Figure 3C:
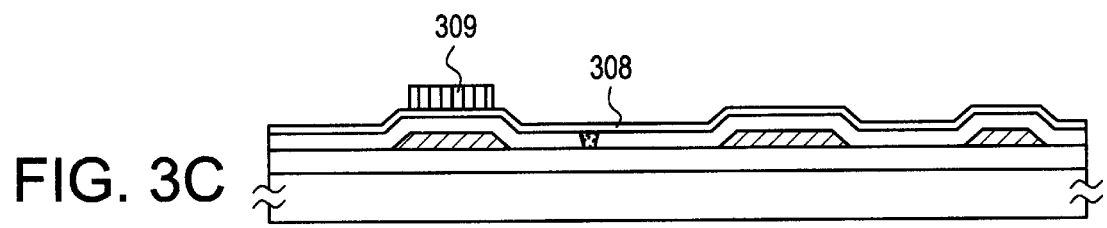
Figure 3D:
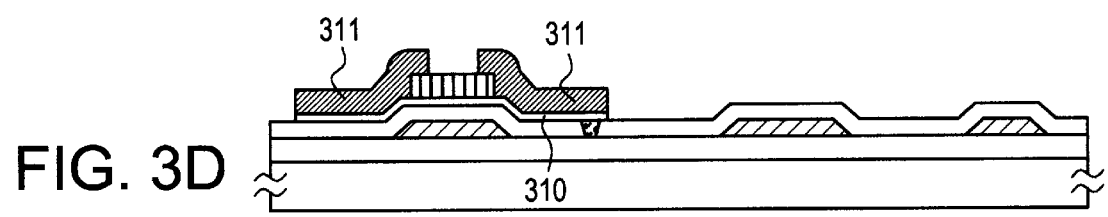

Thereafter, a 300 Å thick amorphous silicon hydride film 308 and a 3,000 Å thick silicon nitride film are sequentially deposited by plasma CVD. An island-like etching stopper 309 is formed by etching the silicon nitride film. The etching stopper 309 may be formed in a self-aligned manner with respect to the gate electrode 303 by using a known back illumination method. (FIG. 3C)

Figure 3E:
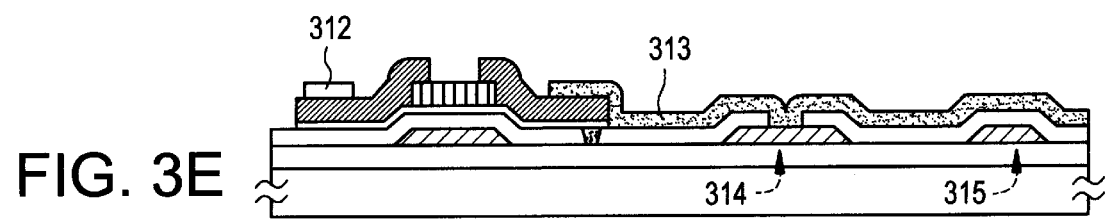

Then, a 3,000 Å thick microcrystalline silicon film that is given N-type conductivity by phosphorus doping is formed by plasma CVD. This microcrystalline silicon film and the previously formed amorphous silicon film 308 are etched to form a source and a drain 311. (FIG. 3D) Subsequently, a contact hole is formed by etching the silicon nitride film 306, which serves as an interlayer insulating film. A 1,000 Å thick ITO (indium tin oxide) film is deposited by sputtering, and etched to form wiring lines 312 and 313. A contact hole for the gate wiring line 304 can easily be formed by etching substantially only the gate insulating film 306. By virtue of filling up the pinholes/cracks 307, interlayer short-circuiting at an intersection 315 of the gate wiring line 305 and the metal wiring line 313 can be prevented. (FIG. 3E)

Embodiment 4

Figure 4A:
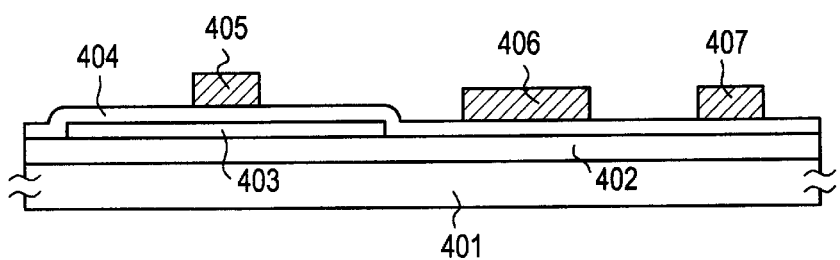
FIGS. 4A to 4E show a manufacturing process according to a fourth embodiment of the invention.

FIGS. 4A to 4E show a manufacturing process of this embodiment. As shown in FIG. 2A, first, a 2,000 Å thick silicon oxide film 402 as a buffer film, a 500 Å thick island-like crystalline silicon region 40 1,200 Å thick silicon oxide film 404, a gate electrode 405, and gate wiring lines 406 and 407 are sequentially formed on a glass substrate 401 (alumina silicate glass; in this embodiment, Corning 1737). The island-like crystalline silicon region 403 is the starting film of the active layer of a TFT. The gate electrode 405 and the gate wiring lines 406 and 407 are made of aluminum added with scandium of 0.3 wt %, and are electrically connected with each other. (FIG. 4A)

Figure 4B:
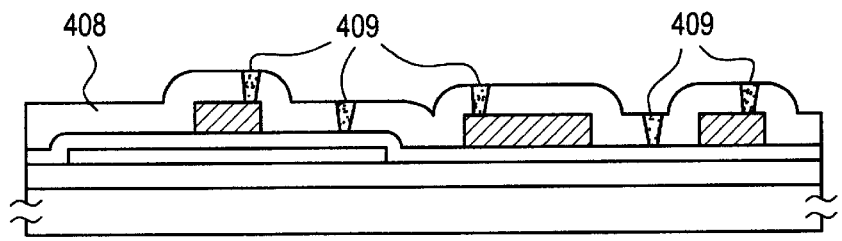

Subsequently, a 4,000 Å thick silicon nitride film 408 as an interlayer insulating film is deposited by plasma CVD. The silicon nitride film 408 serves as a passivation film for preventing moisture in the air from being introduced into the TFT. At this stage, a number of pinholes/cracks 409 exist in the silicon nitride film 408. (FIG. 4B)

By etching only the part of the silicon nitride film 409 covering the island-like crystalline silicon region 403, an interlayer insulating 410 is formed which covers the gate wiring lines 406 and 407 but exposes the gate electrode 405. To prevent the silicon oxide film 404 and the aluminum gate electrode 405 from being etched in this etching step, it is necessary to use a etchant having a large selective etching ratio of silicon nitride to silicon oxide and aluminum. For example, fluorine trichloride (ClF$_3$) and fluorine chloride (ClF) may be used. A fluorine trichloride gas has an etching speed for silicon nitride which is about 10 times faster than that for silicon oxide. Further, a fluorine trichloride gas fluoridates a surface layer (about 1,000 Å in thickness) of aluminum but does not etch it.

Figure 4C:
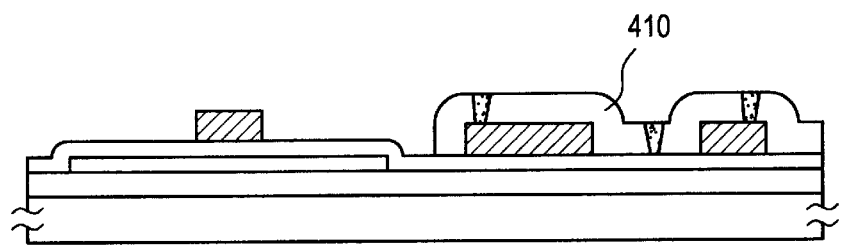

In an actual process, the etching is performed such that the glass substrate 401 having a patterned photoresist is kept at the room temperature to 150° C. and left in an atmosphere of a fluorine trichloride. After the reaction is completed, the substrate 401 is cleaned by water, so that the aluminum fluoride coating on the gate electrode 405 is dissolved and the aluminum surface is exposed. (FIG. 4C)

Thereafter, the pinholes/cracks 409 existing in the interlayer insulating film 410 are filled up by anodic oxidation. First, the glass substrate 401 and a platinum electrode (negative electrode) are immersed in an ethylene glycol solution containing 5%-ammonium tartrate (pH=6.9 to 7.1). A positive voltage is applied to the gate electrode 405 and the gate wiring lines 406 and 407 on the glass substrate 401, whereas a negative voltage is applied to the platinum electrode. The voltage difference is increased to a maximum of 120 V at a rate of 1 to 10 V/min. As a result, the surfaces of the portions of the gate wiring lines 406 and 407 which portions are exposed by the pinholes/cracks 409 are anodized to fill up the pinholes/cracks 409. Further, an anodic oxide layer 411 is formed on the side and top surfaces of the gate electrode 405 which surfaces are not covered with any interlayer insulating film. In this embodiment, the anodic oxide layer 411 is 2,000 Å in thickness.

Figure 4D:
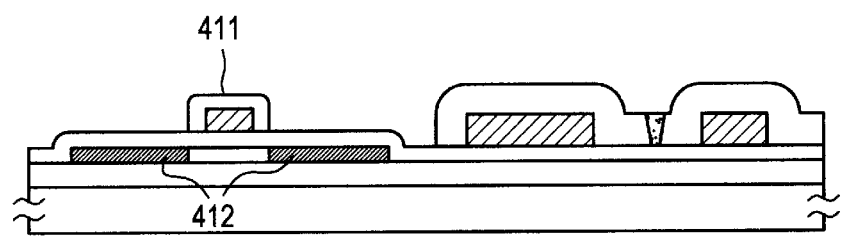

Then, N-type impurity regions (a source and a drain) 412 are formed in a self-aligned manner by using the gate electrode 405 and the portions of the anodic oxide layer 411 on the side surfaces of the gate electrode 405. (FIG. 4D)

Subsequently, contact holes for the source and drain 412 of the TFT are formed by etching the silicon oxide film 404. A contact hole for the gate wiring line 406 is then formed by etching the interlayer insulating film 410. These two kinds of contact holes may be formed simultaneously. However, to complete the etching of the interlayer insulating film 410 made of silicon nitride and the etching of the silicon oxide film 404 approximately at the same time, the thicknesses of those films need to be determined in consideration of the etching rates of silicon nitride and silicon oxide. Since it is very difficult to determine the film thicknesses in such a manner, it is preferred that the two kinds of contact holes be formed separately when the gate insulating film and the interlayer insulating film have different compositions as in this embodiment.

Figure 4E:
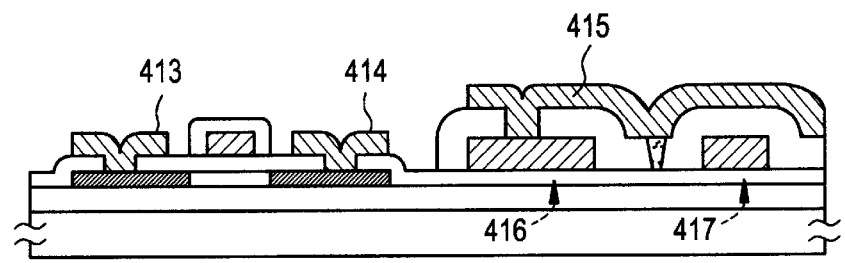
Figure 5A:
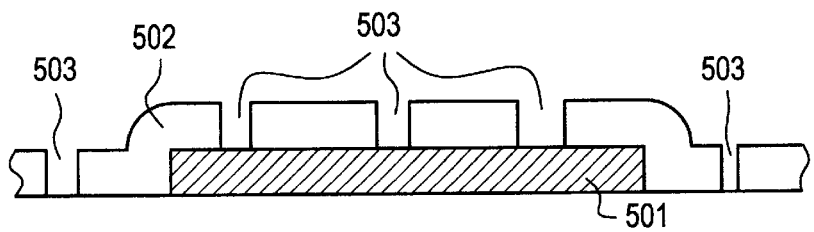
FIGS. 5A to 5C illustrate the principle of the present invention.
Figure 5B:
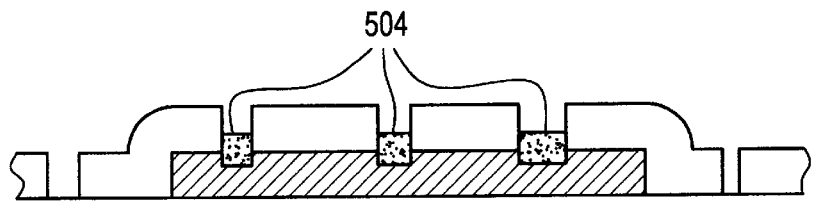
Figure 5C:
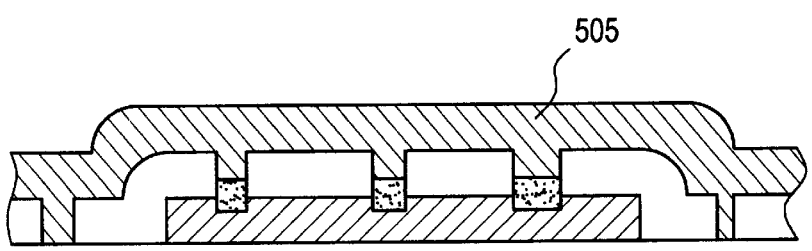
Figure 6A:
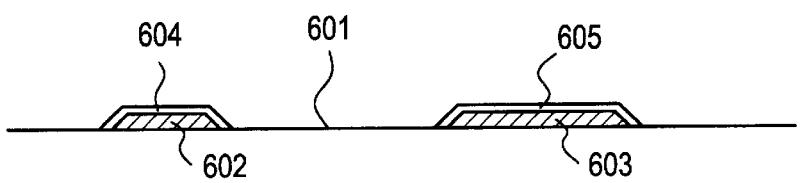
FIGS. 6A to 6C show a conventional manufacturing process.
Figure 6B:
Figure 6C:
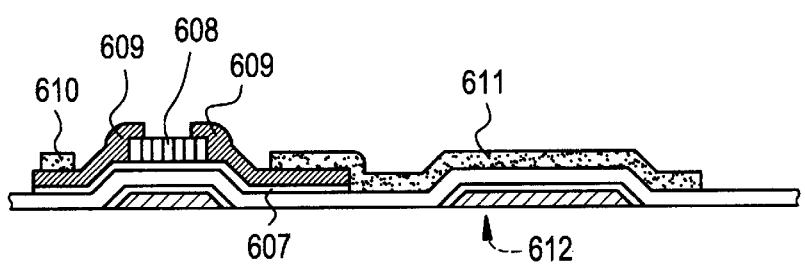

Thereafter, upper wiring lines 413, 414 and 415 are formed by using a metal mainly made of aluminum. A contact hole 416 for the gate wiring line 406 can easily be formed by etching substantially only the interlayer insulating film 410. By virtue of filling up the pinholes/cracks 409, there occur no interlayer short-circuiting at an intersection 417 of the gate wiring line 407 and the wiring line 415. (FIG. 4E)

In the embodiment, as described above by way of the first to fourth embodiments, before forming an upper metal wiring line, anodic oxide portions are formed by anodizing a lower metal wiring line to thereby fill up pinholes/cracks existing in an interlayer insulating film. Therefore, short-circuiting between the wiring lines can be prevented. Further, a contact hole for the lower wiring line can be formed easily. This invention is thus very useful from the industrial point of view.

While the present invention has been described with reference to the preferred embodiments, it is to be understood that the present invention should not be limited to those specific examples of the embodiments. For example, the interlayer insulating film which is formed on the anodizable wiring may be formed by various methods such as CVD, PVD, sputtering, or a coating method using a liquid precursor, etc. Also, the insulating film may be silicon nitride, silicon oxide, silicon oxinitride or any other suitable materials.

What is claimed is:

1. A method of manufacturing a semiconductor device comprising the steps of:

forming a semiconductor island over a substrate;

forming a gate insulating film on said semiconductor island;

forming a first wiring comprising an anodizable material on said gate insulating film, said first wiring having a first portion extending over said semiconductor island and a second portion below which said semiconductor island does not exist;

forming an interlayer insulating film covering a part or whole surface of the second portion of said first wiring;

applying a positive voltage to said first wiring with said first wiring immersed in an electrolyte, thereby, filling pinholes which exist in said interlayer insulating film with an anodic oxide material after forming said interlayer insulating film; and forming a second wiring over the second portion of said first wiring, with said interlayer insulating film interposed between said first and second wirings.

2. A method according to claim 1 wherein said first wiring is a gate wiring.

3. A method according to claim 1 wherein said first wiring comprises a material selected from the group consisting of aluminum, and tantalum, titanium.

4. A method according to claim 1 wherein said first wiring is isolated from any wiring and a conductive material which exist below said first wiring.

5. A method according to claim 1 wherein said positive voltage is not larger than 100 V.

6. A method of manufacturing a semiconductor device including a first wiring and a second wiring extending across said first wiring, the method comprising the steps of:

forming a semiconductor island over a substrate;

forming a gate insulating film on said semiconductor island;

forming said first wiring comprising an anodizable material on said gate insulating film, said first wiring having a first portion extending over said semiconductor island and a second portion below which said semiconductor island does not exist;

forming an interlayer insulating film covering a part or whole surface of the second portion of said first wiring, said portion corresponding to an intersection at which said second wiring crosses said first wiring;

immersing said substrate and a cathode into an electrolyte;

applying a positive voltage to said first wiring while applying a negative voltage to said cathode in said electrolyte after forming said interlayer insulating film; and forming said second wiring over said first wiring.

7. A method according to claim 6 wherein said first wiring is a gate wiring.

8. A method according to claim 6 wherein said first wiring comprises a material selected from the group consisting of aluminum, and tantalum, titanium.

9. A method according to claim 6 wherein said first wiring is isolated from any wiring and a conductive material which exist below said first wiring.

10. A method according to claim 6 wherein the voltage between said cathode and said first wiring is not larger than 100 V.

11. A method of manufacturing a semiconductor device comprising the steps of:

forming a semiconductor island over a substrate;

forming a gate insulating film on said semiconductor island;

forming a first wiring comprising an anodizable material on an insulating surface, said first wiring having a first portion extending over said semiconductor island and a second portion below which said semiconductor island does not exist;

covering a part or whole surface of the second portion of the first wiring with an interlayer insulator;

performing an anodic oxidation selectively on said first wiring in order to form an anodic oxide film on the first portion of said first wiring wherein pinholes of said interlayer insulator are plugged with an anodic oxidized material of said first wiring after forming said interlayer insulator; and forming a second wiring on the second portion of said first wiring with said interlayer insulator interposed therebetween.

12. A method of manufacturing a semiconductor device comprising the steps of:

forming a semiconductor island over a substrate;

forming a gate insulating film on said semiconductor island;

forming a first wiring comprising an anodizable material on an insulating surface, said first wiring having a first portion and a second portion;

covering only the second portion of said first wiring with an interlayer insulator, wherein said interlayer insulator is deposited by vapor phase deposition;

performing an anodic oxidation on said first wiring including said first and second portions in order to form an anodic oxide film selectively on the surface of the first portion of said first wiring after forming said interlayer insulator; and forming a second wiring extending across said first wiring wherein said second wiring is isolated from said first wiring by said interlayer insulator.

* * * * *